Oct. 15, 1968 A. P. DAVIDSON ET AL 3,406,246
ARTICLES FOR PRINTED CIRCUIT REPAIR
Filed July 11, 1966
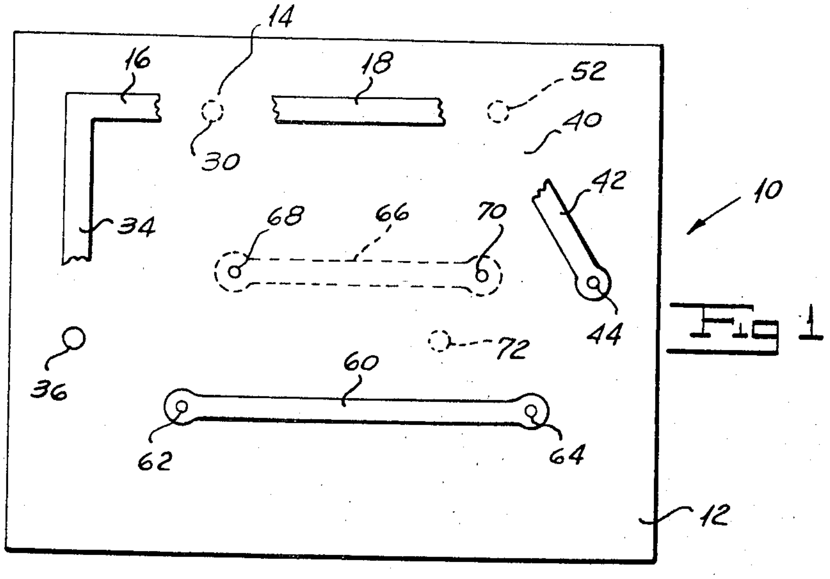
FIG. 1
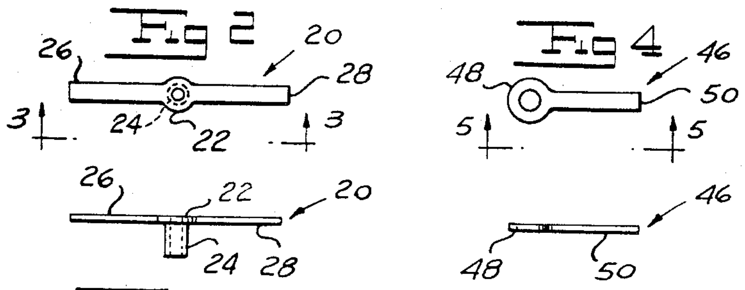
FIG. 2, FIG. 4
FIG. 3
FIG. 5
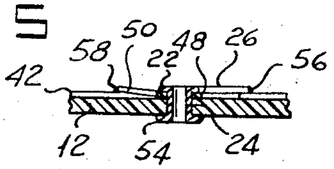
FIG. 8
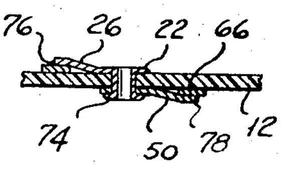
FIG. 7
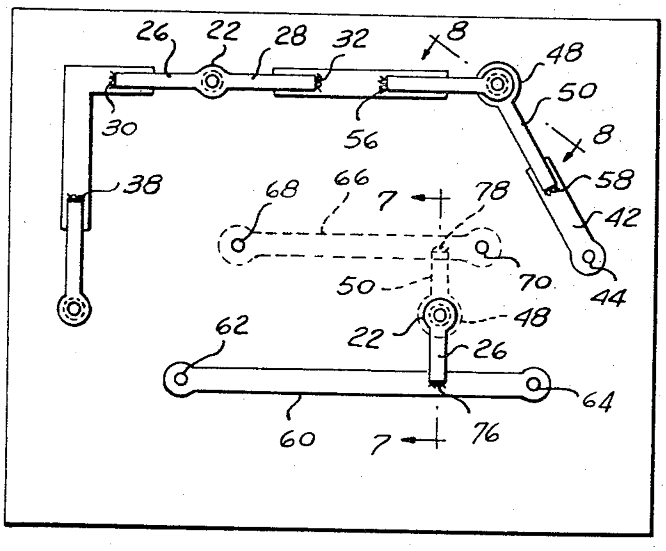
FIG. 6
INVENTORS
Arthur P Davidson
Andrew N Mangum
BY
Shenier & O'Connor
ATTORNEYS

United States Patent Office 3,406,246

Patented Oct. 15, 1968

3,406,246

ARTICLES FOR PRINTED CIRCUIT REPAIR

Arthur P. Davidson, Westport, and Andrew N. Mangum, Orange, Conn., assignors to United Aircraft Corporation, East Hartford, Conn., a corporation of Delaware Filed July 11, 1966, Ser. No. 564,306
7 Claims. (Cl. 174—68.5)

ABSTRACT OF THE DISCLOSURE

In general our invention contemplates the provision of printed circuit repair elements and of a method of using the same to connect printed conductors in which a grommet or eyelet of a length greater than the thickness of the circuit board is provided with one or more arms for engaging printed conductors. The eyelet is passed through the hole in the board and may also be passed through an opening in a pad having an arm for engaging the conductor. After the arms have been engaged with the proper conductors, the end of the eyelet remote from its arms is upset securely to retain the elements on the board and the arms are soldered or welded to the conductors.

*Background of the invention*

There are known in the prior art printed circuit boards wherein thin films of conductive material providing circuit elements and conductors are bonded to a support board of insulating material to provide various interconnections between elements which are applied to the board. Any suitable insulating material may be used to form the board. For example, the board may be made of glass fiber laminates impregnated with an epoxy resin; they may be formed of glass fiber impregnated with a silicone resin; or they may be glass fiber laminates impregnated with polytetrafluoroethylene. Other boards may be made of polystyrene sheets or even of unreinforced polytetrafluoroethylene sheets.

Conductive material for forming the required conductors may be applied in any suitable manner as, for example, by silk screen printing process, by a lithographic offset printing process or by etching foil which is bonded to the board. A further process which might be used in an electroplating process to deposit the desired pattern of conductive material.

Most of the printed circuit boards known to the art are provided with punched holes through which component leads are passed to attach the components to the board. This may be accomplished by automatic component inserting machines.

Occasions arise wherein breaks in conductors of a printed circuit board must be repaired. Moreover, it is often desirable to modify the circuit by changing interconnections between the deposited conductors and by providing additional terminals to permit further components to be assembled on the board. While the technique of manufacturing printed circuit boards is relatively well advanced, no simple and expeditious manner is known to the art for permitting the boards to be repaired or modified. It will readily be appreciated that resubjecting the board to the original manufacturing techniques for minor repairs or modifications is so expensive as to render the operation entirely impracticable. While repairs can be made by cutting and soldering lengths of conductive material as required to produce the desired repair or modification, this becomes an operation which must be tailored to each change or repair to be made. Owing to the fact that certain elements are so small, difficulty in handling is great. Moreover, the parts for repair cannot easily be bonded to the board as is necessary for effective repairing. Owing to these facts many boards which might be salvaged are merely disposed of.

*Description of the invention*

We have invented printed circuit repair elements and a method of using the same which greatly facilitates repair and modification of printed circuits. Our elements cooperate to permit a large variety of repairs and modifications to be made with the use of only two repair elements. The elements are securely attached to the board during the repair operation to avoid the subsequent danger of breaking loose. Our elements and method permit repairs and modifications to be made with a minimum of expense. We are able to salvage boards which heretofore have been junked.

One object of our invention is to provide printed circuit repair elements and a method of using the same to repair or modify printed circuits in a rapid and expeditious manner.

Another object of our invention is to provide printed circuit repair elements adapted to accomplish a wide variety of repairs and modifications with the use of only two elements.

A further object of our invention is to provide printed circuit repair elements and a method of using the same wherein the repair elements are securely attached to the board.

A still further object of our invention is to provide printed circuit repair elements and a method of using the same for repairing and modifying printed circuit boards at a minimum of expense.

Yet another object of our invention is to salvage boards which otherwise would be junked.

Other and further objects of our invention will appear from the following description.

In the accompanying drawings which form part of the instant specification and which are to be read in conjunction therewith and in which like reference numerals are used to indicate like parts in the various views:

FIGURE 1 is a plan view schematically illustrating various conditions of printed circuits necessitating repair or modification.

FIGURE 2 is a plan view of one of our printed circuit repair elements.

FIGURE 3 is a side elevation of the form of our printed circuit repair element shown in FIGURE 2 taken along the line 3—3 of FIGURE 2.

FIGURE 4 is a plan view of another of our printed circuit repair elements.

FIGURE 5 is an elevation of the form of our printed circuit repair elements shown in FIGURE 4 taken along the line 5—5 of FIGURE 4.

FIGURE 6 is a plan view of the circuit board of FIGURE 1 illustrating the manner in which repairs and modifications are accomplished by use of our repair elements pursuant to our method.

FIGURE 7 is a fragmentary sectional view of one portion of the printed circuit board shown in FIGURE 6 taken along the line 7—7 of FIGURE 6.

FIGURE 8 is a fragmentary sectional view of a portion of the printed circuit board shown in FIGURE 6 taken along the line 8—8 of FIGURE 6.

Referring now to the drawings we have shown a printed circuit board indicated generally by the reference character 10 comprising the board 12 which may be formed of any suitable material such as those described above. Our elements and method facilitate the repair of a variety of different circuit deflects. One such defect is a break 14 between a pair of aligned conductor portions 16 and 18.

As will be apparent from the description hereinabove, the conductor portions 16 and 18 may be, for example, copper either deposited on the board 10 or formed from a foil which is bonded to the board.

We are able to repair the break 14 by use of only one of our elements indicated generally by the reference character 20. The element 20 includes an eyelet 22, the tubular portion 54 of which has a length which is greater than the thickness of the circuit board in use. For example, we have discovered that for a 1/16-inch thick board 12 the length of the tubular portion 24 should be about 0.10 inch. Similarly for a 3/32-inch thick board, tube 24 has a length of about 0.13 inch and for a 1/8-inch thick board, portion 24 has a length of about 0.17 inch. We form the element 20 with respective arms 26 and 28 extending in generally diametrically opposite directions from the eyelet 22. Element 20 may be made of any suitable conductive material such, for example, as a thin copper sheet from which the element may be drawn and punched. We have found that a copper sheet of a thickness of 0.008 inch is suitable for most applications. Other dimensions of a typical element 20 would be a diameter of 0.10 inch for the flange of the eyelet 22 with a tubular diameter of about 0.063 inch for the tubular portion 24. Each of the arms may, for example, have a width of 0.04 inch and be 0.23 inch long from the axis of tube 24 to the end of the arm. Preferably we solder-coat or tin-plate the element after its formation.

In use of the element 20 to repair the break 14 we first drill a hole in the region indicated by the broken line circle 30 in FIGURE 1 approximately halfway between the broken ends of the conductor portions 16 and 18. When the hole has been drilled we insert the tubualr portion 24 in the hole and dispose the arms 26 and 28 over the conductor portions 16 and 18. When that has been done, the end of the tubular portion 24 may be upset by any suitable means known to the art such, for example, as an eyeleting punch. Once the element 20 has thus been securely positioned, we solder or weld the ends of the arms 26 and 28 to the conductor portions 16 and 18 as indicated at 30 and 32 to ensure good electrical connections.

A second condition which is easily repaired by use of the element 20 in somewhat modified form is to replace an electrical connection from a conductor portion 34 to a terminal hole 36 which, as is known in the art, is provided in the board 12 for the reception of a component lead (not shown) to be attached to the conductive length 34. In repairing a circuit defect of this type, we need only use one of the arms 26 and 28 and for that reason may remove the arm 28 by clipping or breaking it away from the eyelet 22. After that has been done, the tubular portion 24 is inserted in the hole 36 and the arm 26 is laid over the end of the conductor length 34. Next, the lower end of the eyelet is upset securely to attach the modified element 20 to the board and arm 26 is welded or soldered to the conductor length 34 as indicated by the reference character 38.

Another type of defect which is readily repairable by use of our method and elements is a break 40 between the conductor portion 18 and another conductor portion 42 leading to a terminal hole 44. In this type of defect, the conductor 42 extends in a direction making an acute angle with the direction of the conductor portion 18. In repairing a break of this type, we employ not only a modified element 20 but also a second element indicated generally by the reference character 46, which for purposes of convenience we have termed a "pad." The pad 46 includes an annular portion 48 and an arm 50 extending radially outwardly from the portion 48. Pad 46 may be stamped out of the same material such, for example, as a copper sheet having a thickness of about 0.008 inch as that of which we make element 20. For an element 20 of the dimensions outlined above, we provide a pad 46, the annular portion 48 of which has an outside diameter of about 0.135 inch and an inner diameter of 0.085 inch. The arm 50 may be 0.04 inch wide and about 0.23 inch in length from the center of portion 48 to the outer end of the arm.

When repairing the break 40 we first drill a hole as indicated by the broken line 52 in FIGURE 1 at the point at which the longitudinal axes of conductor portions 18 and 42 intersect. Once the hole is drilled we place the opening of the annular portion 48 of a pad 46 over hole 52 and then we insert the tubular portion 24 through the annular portion 48 and through the hole 52. In this instance before assembling the elements, we break off one of the arms such as the arm 28 of the element 20 since that arm is not required to make the necessary connections. After the elements have been assembled, we so position them with respect to the conductor portions 18 and 42 that the end of arm 26 overlies the conductor portion 18 and the end of arm 50 overlies conductor portion 42. Next we upset the underside of the tubular portion 24 to form a retaining lip 54 firmly to secure the elements 20 and 46 to the board. Next the ends of the arms 26 and 50 are soldered or welded to the conductor portions 18 and 42 as indicated by reference characters 56 and 58 to provide good electrical connections.

Our elements are useful not only to repair damage to printed circuits but also to permit modification of the circuit carried by the board in a rapid and expeditious manner. For purposes of illustration let us assume the following conditions. The upper surface of the board 12 carries a conductor 60 extending between two terminal holes 62 and 64. Further assume that the underside of the board 12 carries a conductor 66 extending between terminal holes 68 and 70. It is desired to provide an additional terminal in a region indicated by the broken line circle 72 in FIGURE 1 and further to make electrical connections to that terminal both from the conductor 60 and from the conductor 66. To achieve these results we first move one of the arms, such as the arm 28, from the element 20. Next we drill a hole in the region 72. After the hole is drilled we insert the tubular portion 24 of the modified element 20 through the hole from the upper surface of the board and place the annular portion 48 of a pad over the protruding lower end of the tubular portion 24 from the underside of the board. Having done this, we position the arm 26 over the conductor 60 and we position the arm 50 in engagement with the conductor 66. Next, by use of the upsetting punch, we upset the lower end of the tubular portion 24 to form a retaining lip 74 which holds the elements firmly in position on the board. The ends of the arms 26 and 50 are welded or soldered to the conductors 60 and 66 as indicated by the reference characters 76 and 78. It will readily be appreciated that the opening of tubular portion 24 permits the insertion of a component lead for connection to conductors 60 and 66 through the arms 26 and 50.

In practice of our method of repairing and modifying printed circuits, we can accomplish a great variety of repairs and modifications with the use of only a drill, an upsetting punch and our two simple elements 20 and 46. To repair an in-line break such as the break 14, we merely drill the hole 30, insert the tubular portion 24 in the hole with arms 26 and 28 in engagement with conductor portions 16 and 18, upset the tubular portion and weld or solder arms 26 and 28 to the conductor portions 16 and 18. To make a connection between portion 34 and terminal hole 36 we merely remove the arm 28, insert the tubular portion 24 in hole 36 with arm 26 in engagement with the portion 34 and perform the upsetting and the welding or soldering operations. An out-of-line break 40 is repaired by drilling a hole 52, positioning the annular portion 48 of a pad 46 over the hole with arm 50 engaging conductor 42, inserting the tubular portion 24 through portion 48 and through the hole with the arm 26 engaging conductor 18 and then upset and weld or solder. A modification such as the provision of a new terminal as well as connections to conductors 60 and 66 is accomplished by drilling hole 72, inserting the tubular portion 24 with arm 26 engaging the conductor 60, slipping annular portion 48 over the protruding end of the tube from under the board 12 with arm 50 engaging conductor 66 and again performing the upsetting and soldering or welding operations.

It will be seen that we have accomplished the objects of our invention. We have provided cooperating elements which greatly facilitate the repair and modification of printed circuits. Our method of repairing and modifying printed circuit boards permits these operations to be accomplished in a simple, rapid, expeditious and inexpensive manner. It enables us to salvage printed circuit boards which otherwise might be wasted.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is, therefore, to be understood that our invention is not to be limited to the specific details shown and described.

Having thus described our invention, what we claim is:

1. In a printed circuit board having conductors thereon comprising part of a printed circuit and having a hole therein, a repair assembly including a first self-supporting element of conductive material comprising a body portion having an arm extending outwardly therefrom, said body portion having a hole aligned with said board hole, a second self-supporting element of conductive material comprising a body portion having an arm extending therefrom, said second element body portion having a projection thereon extending through the board hole and through the hole of said first element body portion for holding said elements assembled on said board.

2. In a printed circuit board as in claim 1 in which said projection is tubular and in which said projection has a lip on the side of said board remote said second element body.

3. In a printed circuit board as in claim 1 in which each of said arms has a terminus, said repair assembly including means providing a respective electric connection between each terminus and a board conductor.

4. In a printed circuit board as in claim 1 in which said projection is tubular and in which said projection has a lip on the side of said board remote said second element body, each of said arms having a terminus, and said repair assembly including means providing a respective electric connection between each terminus and a board conductor.

5. In a printed circuit board having conductors on both sides thereof and having a hole therein, a repair assembly including a first self-supporting element of conductive material on one side of said board, said first element having a body portion provided with a hole aligned with a board hole and having an arm extending from said body portion, a second self-supporting element of conductive material on the other side of said board, said second element having a body portion and having an arm extending from said body portion, said second element body portion having a projection extending through said board hole and through said first element body hole and into engagement with said elements in assembled relationship with said board.

6. In a printed circuit board as in claim 5 in which each of said arms has a terminus, said repair assembly including means providing respective electrical connections between said arms and printed circuit conductors on the respective sides of said board.

7. In a printed circuit board having conductors thereon comprising part of a printed circuit and having a hole therein, a repair assembly including a first self-supporting element of conductive material comprising a body portion having an arm extending outwardly therefrom, said body portion provided with a hole overlying said board hole, a second self-supporting element of conductive material comprising a body portion having an arm extending therefrom, said second element body portion overlying said first element body portion and a projection on said second body portion extending through the hole of said first body portion and into said board hole for assembling said elements on said board.

References Cited

UNITED STATES PATENTS

| | | | |
|---|---|---|---|
| 2,875,264 | 2/1959 | Gross. | |
| 2,915,680 | 12/1959 | Kong | 174—68.5 XR |
| 2,955,351 | 10/1960 | McCreadie. | |
| 2,997,680 | 8/1961 | Arthur | 174—68.5 XR |
| 3,114,080 | 12/1963 | Koda et al. | 174—68.5 XR |

FOREIGN PATENTS

| | | |
|---|---|---|
| 273,737 | 12/1927 | Great Britain. |

DARRELL L. CLAY, *Primary Examiner.*

U.S. DEPARTMENT OF COMMERCE
PATENT OFFICE
Washington, D.C. 20231

UNITED STATES PATENT OFFICE

CERTIFICATE OF CORRECTION

Patent No. 3,406,287 October 15, 1968

George V. Zito et al.

It is certified that error appears in the above identified patent and that said Letters Patent are hereby corrected as shown below:

Column 8, line 15, claim reference numeral "13" should read -- 8 --.

Signed and sealed this 24th day of February 1970.

(SEAL)
Attest:

Edward M. Fletcher, Jr.
Attesting Officer

WILLIAM E. SCHUYLER, JR.
Commissioner of Patents